United States Patent
Pasotti et al.

(10) Patent No.: US 6,897,710 B2
(45) Date of Patent: May 24, 2005

(54) VOLTAGE SUPPLY DISTRIBUTION ARCHITECTURE FOR A PLURALITY OF MEMORY MODULES

(75) Inventors: Marco Pasotti, S. Martino Siccomario (IT); Guido De Sandre, Brugherio (IT); David Iezzi, Osnago (IT); Gilberto Muzzi, Olgiate Molgora (IT); Marco Poles, Ghedi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/748,697

(22) Filed: Dec. 30, 2003

(65) Prior Publication Data

US 2004/0201414 A1 Oct. 14, 2004

(30) Foreign Application Priority Data

Dec. 30, 2002 (EP) .......................................... 02425809

(51) Int. Cl.[7] .............................................. G05F 1/10
(52) U.S. Cl. ..................................................... 327/536
(58) Field of Search .................................. 327/530, 534, 327/535, 536, 537

(56) References Cited

U.S. PATENT DOCUMENTS

| 6,349,063 B1 | 2/2002 | Jibu ...................... 365/189.11 |
| 6,434,044 B1 | 8/2002 | Gongwer et al. ...... 365/185.18 |
| 2001/0014039 A1 | 8/2001 | Longwell et al. ........... 365/200 |
| 2002/0141238 A1 | 10/2002 | Pasternak ............... 365/185.11 |

Primary Examiner—Jeffrey Zweizig
(74) Attorney, Agent, or Firm—Lisa K. Jorgenson; Allen, Dyer, Doppelt, Milbrath & Gilchrist, P.A.

(57) ABSTRACT

An architecture for distributing supply voltages to a plurality of memory modules supplied through a plurality of charge pump circuits may include a sorting block bi-directionally connected to the plurality of memory modules, from which it may receive a plurality of power requests. The sorting block may provide a sorting signal based upon a priority scale to drive the plurality of charge pump circuits and distribute supply voltages to the plurality of memory modules. The architecture may advantageously be software-configurable.

25 Claims, 2 Drawing Sheets

VOLTAGE SUPPLY DISTRIBUTION ARCHITECTURE FOR A PLURALITY OF MEMORY MODULES

FIELD OF THE INVENTION

The present invention relates to electronic circuits, and, more particularly, to a power voltage supply distribution architecture for a plurality of memory modules. More specifically, the invention relates to an architecture for distributing supply voltages to a plurality of memory modules supplied through a plurality of charge pump circuits.

BACKGROUND OF THE INVENTION

By way of example, the present is particularly well suited (though not exclusively) to an architecture for distributing supply voltages to a plurality of Flash memory modules. The following description is provided with reference to this field of application for clarity of illustration only.

A Flash non-volatile memory requires a plurality of voltages, which are generated from a same supply voltage reference Vdd. In particular, to correctly perform the different operations (reading, programming, and erasing) on Flash memory cells, some voltages among the plurality of voltages need to have a higher value than the supply voltage Vdd, while other voltages need to have negative values. That is, these are values lower than a ground voltage reference GND, corresponding to a zero or null voltage value.

To increase memory performance, the memory may be split into several banks or modules, and the above-noted operations (i.e., reading, programming, and erasing) are performed in parallel on different banks. Memory architectures capable of performing a reading operation on different banks are known in the art. Examples of such memory architectures are described in U.S. Pat. Nos. 5,691,955 (assigned to Mitsubishi Electric) and 5,684,752 (assigned to Intel).

Memory architectures capable of performing reading and programming operations in parallel are also known, and examples thereof are described in U.S. Pat. Nos. 5,245,572 (assigned to Intel) and 5,867,430 to Chen et al., for example. The memory architecture described in the Chen et al. patent is also capable of performing reading and erasing operations in parallel as well.

Such architectures may have certain limitations. First, it may not be possible to perform programming and erasing operations in parallel. Moreover, these architectures are not capable of managing more than two parallel operations. Additionally, these architectures are not capable of managing requests from a number of banks that is different from the number contemplated during the design of the architecture, unless the hardware structure of the architecture itself is changed.

SUMMARY OF THE INVENTION

The technical problem underlying the present invention is to provide an architecture for distributing supply voltages to a non-volatile memory. More particularly, the memory may be of the Flash type and organized in memory modules capable of generating different voltages needed for the correct operation of the memory itself. Moreover, this is to be done while ensuring total parallelism between the reading, programming and erasing operations to be performed on memory cells, as well as the correct management of a plurality of requests coming from different memory modules, to thus overcome the limitations currently affecting the architectures according to the prior art.

The present invention provides an architecture for distributing supply voltages to a plurality of memory modules including a block for generating the voltages required for the correct operation of the memory. This block is physically and functionally separated from a block for managing the requests received from the banks included in the memory.

In accordance with the invention, an architecture for distributing supply voltages to a plurality of memory modules supplied through a plurality of charge pump circuits may include an arbitrator block bi-directionally connected to the plurality of memory modules, from which it may receive a plurality of power requests. The arbitrator block may sort the power requests based upon a priority scale to drive the plurality of charge pump circuits, and distribute supply voltages to the plurality of memory modules. The architecture may advantageously be software-configurable.

BRIEF DESCRIPTION OF THE DRAWINGS

The various features and advantages of the architecture according to the present invention will be further understood from the following description of an embodiment thereof, which is given by way of non-limiting example, with reference to the attached drawings, in which.

DETAILED DESCRIPTION OF THE PREFERRED EMBODIMENTS

Figure 1:
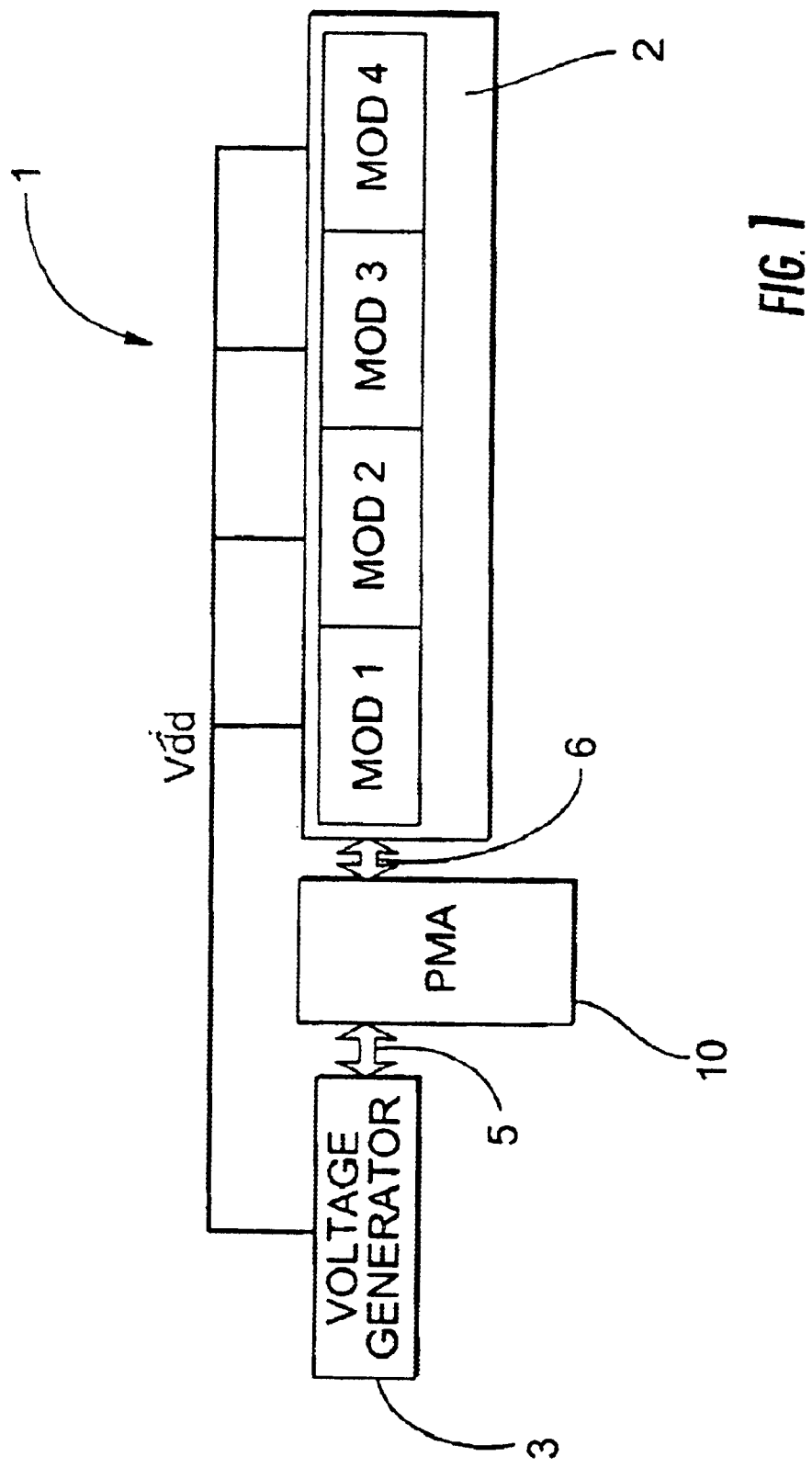
FIG. 1 is a schematic block diagram illustrating a memory device including an architecture for distributing supply voltages to a plurality of memory modules in accordance with the present invention.

With reference to FIG. 1, a Flash non-volatile memory device 1 including a memory section 2 organized in banks or memory modules Mod1, . . . ModN is first described. In the illustrated example, the Flash memory section 2 includes the four memory modules Mo1, . . . , Mod 4 which are connected to a supply voltage reference Vdd. The Flash memory device 1 also includes a voltage generator block 3.

As mentioned above with reference to the prior art, for the correct operation of Flash memory modules it is necessary to generate a plurality of voltages Vhigh1, . . . , VhighN with a higher value than the supply voltage reference Vdd, as well as a plurality of negative value voltages Vneg1, . . . , VnegN. It should be noted that for generating these supply voltages Vhigh1, . . . , VhighN and Vneg1, . . . , VnegN, a plurality of charge pump circuits Pump1, . . . , PumpM included in the voltage generator block 3 are generally used. Each charge pump is capable of supplying a predetermined amount of current.

In accordance with the invention, the memory device 1 advantageously includes an arbitrator block 10 inserted between the charge pump circuits Pump1, . . . , PumpM of the voltage generator block 3 and the plurality of memory modules Mod1, . . . , ModN. More particularly, the block 10 is connected to the voltage generator block 3 through a first bi-directional bus 5, and to the Flash memory section 2 through a second bi-directional bus 6.

The block 10 advantageously receives a plurality of requests for supply voltage values (herein "power requests") from the memory modules. The block 10 conveniently drives the charge pump circuits Pump1, . . . , PumpM of the voltage generator block 3 to ensure correct values for the supply voltages Vhigh1, . . . , VhighN and Vneg1, . . . , VnegN sent to the plurality of memory modules Mod1, . . . , ModN. The block 10 therefore provides an architecture for distributing supply voltages generated by the plurality of charge pump circuits for the plurality of memory modules during the different operating steps of the memory device.

Figure 2:
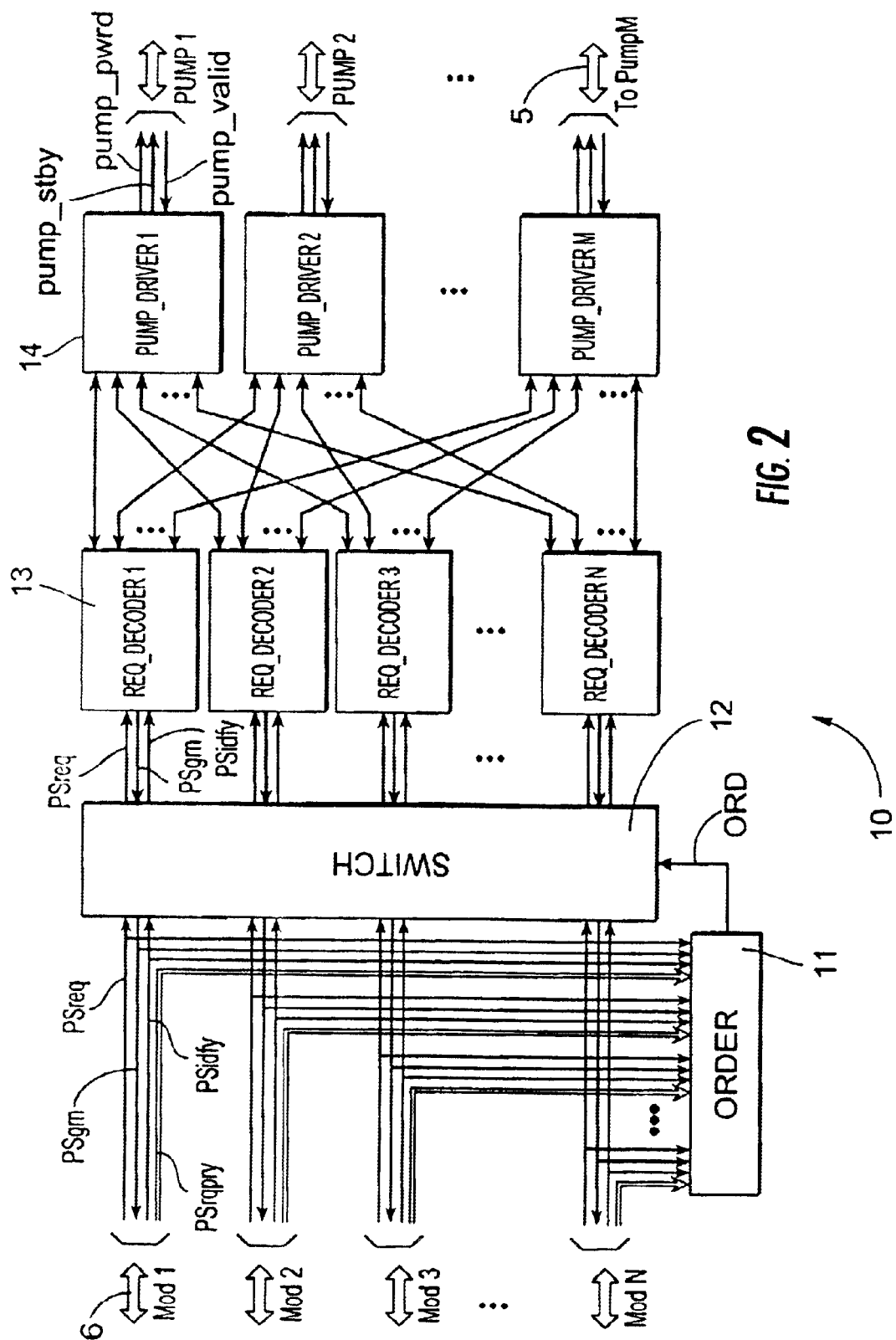
FIG. 2 is a schematic block diagram illustrating in greater detail the architecture for distributing supply voltages of FIG. 1.

Turning now additionally to FIG. 2, the architecture 10 illustratively includes a sorting block 11 which is input-connected to the second bi-directional bus 6, from which it receives a power request signal PSreq from a memory module of the plurality of modules. The second bi-directional bus 6 may also include an identification bus PSidfy for identifying the operation required, and a priority bus PSrqpry for the request signal PSreq.

The sorting block 11 also receives at its input a request allocation signal PSgrn from a switching block 12, and it outputs to the switching block a sorting signal ORD of the power requests received from the plurality of modules Mod1, . . . , ModN. The switching block 12 receives, in turn, the power request signal Psreq. The switching block 12 is connected to the identification bus PSidfy which identifies the operation required, and to the priority bus Psrqpry. The switching block 12 provides, through the second bi-directional bus 6, the sorting block 11 and the plurality of memory modules Mod1, . . . , ModN with the request allocation signal PSgrn.

The switching block 12 is also bi-directionally connected to a plurality of request decoders 13, to which it provides the power request signal Psreq, and from which it receives the request allocation signal PSgrn. The switching block 12 is also connected to the plurality of decoders 13 through the identification bus PSidfy.

The plurality of request decoders 13 are connected in a multiplexed, bi-directional fashion to a plurality of driving circuits 14. The driving circuits 14, in turn, are connected through the first bi-directional bus 5 to the plurality of charge pump circuits Pump1, . . . , PumpM of the voltage generator block 3, to which they provide the following signals: the activation signal pump_pwd of a corresponding charge pump circuit; and a stand-by mode signal pump_stby of a corresponding charge pump circuit.

The driving circuits 14 also receive from the plurality of charge pump circuits Pump1, . . . , PumpM a validity signal pump_valid. This signal provides the information that the charge pump has reached the desired value.

It is possible to configure various functions using software. For example, such functions may include the correspondence between the type of operation required and the charge pumps needed to satisfy it, power down and stand-by times, and the number of requests which can be satisfied by each charge pump at a given time.

In accordance with the invention, the plurality of modules Mod0, . . . , ModN may advantageously be connected to the architecture 10 for distributing supply voltages. The same plurality of charge pump circuits Pmp1, . . . , PumpM may therefore be shared for generating the supply voltages Vhigh1, . . . , VhighN and Vneg1, . . . , VnegN needed for the correct operation of the modules themselves. The architecture 10 for distributing supply voltages, knowing how many operations may be supported by a predetermined charge pump circuit, may allow lower priority operations to wait until the corresponding charge pump circuits are free.

Operation of the architecture 10 for distributing supply voltages according to the invention will now be described in greater detail. The sorting block 11 processes the voltage requests received from the plurality of modules Mod1, . . . , ModN on the basis of the following rules: request state (i.e., the request being already active or new request); priority information; and position of the module which has performed the request.

The switching block 12 identifies the requests to be satisfied based upon the signal received from the sorting block 11. The switching block 12 spreads the corresponding signals to the plurality of request decoders 13, which in turn enable the corresponding driving circuits 14 of the charge pump circuits Pump1, . . . , PumpN. Particularly, driving circuits 14 manage the power-down and stand-by conditions of the plurality of charge pump circuits Pump1, . . . , PumpM. The architecture 10 for distributing supply voltages thus provides for the scheduling of power requests received from the memory modules Mod1, . . . , ModN through a priority-scale-based sorting.

In one exemplary implementation of the sorting block 11, a priority scale may be used in which reading operations are given priority with respect to programming operations, and programming operations are given priority with respect to erasing operations. Moreover, for the same operation, modules which are closer to the architecture 10 may be given priority with respect to further modules. For example, with reference to FIG. 1, the module Mod1 may be considered as the closest module and the module Mod4 the farthest from the architecture 10. In other words, the priority scale includes a priority classification of the different operations (i.e., reading, writing, and erasing) which can be performed on the memory cells of modules Mod1, . . . , Mod4, or of the requests received from the different modules.

In addition, the architecture 10 may be implemented to sort the requests of the plurality of independent modules (Mod1, . . . , ModN) in a single cycle of the memory device 1 clock signal. By way of example, the clock signal may have a frequency of less than or equal to 250 MHz. It should also be noted that the delay introduced by the architecture 10 may be reduced to a single cycle of the memory device clock signal in some implementations.

In conclusion, the architecture 10 for distributing supply voltages according to the invention may be relatively easily implemented and has several advantages. First, it provides parallelism of the different operations (reading, writing, and erasing) performed on the memory cells of the different modules. Also, it allows several requests received from the modules to be managed by sorting them based upon a predetermined priority scale. Further, a relatively large number of modules to be managed may be connected to a same arbitrator, and the priority with which operations are to be managed may be software-reconfigured.

That which is claimed is:

1. A memory device comprising:
   a plurality of memory modules for performing memory operations and generating power requests therefor;
   a plurality of charge pump circuits for generating supply voltages for said memory modules; and
   an arbitrator for receiving the power requests from said memory modules, sorting the power requests for said charge pump circuits based upon a priority scale, and distributing the supply voltages from said charge pump circuits to said memory modules based upon the sorted power requests.

2. The memory device of claim 1 wherein said arbitrator comprises:
   a sorting block connected to said memory modules for sorting the power requests and generating a sorting signal based thereon; and a switching block connected between said memory modules and said charge pump circuits for providing the sorted power requests to said charge pump circuits based upon the sorting signal, and distributing the supply voltage from said charge pump circuits to said memory modules based upon the sorted power requests.

3. The memory device of claim 2 wherein said switching block provides request allocation signals to said sorting block, and wherein said sorting block sorts the power requests based thereon.

4. The memory device of claim 3 further comprising a plurality of request decoders connected between said charge pump circuits and said switching block, said request decoders receiving the power requests from said switching block and generating the request allocation signals therefor.

5. The memory device of claim 4 further comprising a plurality of driving circuits for said charge pump circuits connected to said request decoders in a multiplexed relationship.

6. The memory device of claim 5 wherein said driving circuits control power-down and stand-by conditions of aid charge pump circuits.

7. The memory device of claim 4 wherein said request decoders generate activation signals and stand-by mode signals for respective charge pump circuits.

8. The memory device of claim 4 wherein said charge pump circuits further generate validity signals for said request decoders indicating that respective supply voltages have been reached.

9. The memory device of claim 1 wherein the priority scale is based upon at least one of request states of the power requests, priority information associated with the power requests, and positions of memory modules generating respective power requests.

10. The memory device of claim 9 wherein the request states comprise active request states and new request states.

11. The memory device of claim 1 further comprising at least one bi-directional bus connecting said arbitrator and said memory modules; wherein said memory modules further generate operation identification signals and priority signals for respective power requests; and wherein said memory modules provide the operation identification signals and priority signals to said arbitrator via said at least one bi-directional bus.

12. The memory device of claim 1 wherein said arbitrator receives a clock signal and processes the power requests within a clock cycle thereof.

13. A arbitrator for distributing supply voltages from a plurality of charge pump circuits to a plurality of memory modules, the memory modules generating power requests, the arbitrator comprising:
    a sorting block connected to the memory modules for sorting the power requests for the charge pump circuits based upon a priority scale and generating a sorting signal based thereon; and
    a switching block connected between the memory modules and the charge pump circuits for providing the sorted power requests to said charge pump circuits based upon the sorting signal, and distributing the supply voltage from said charge pump circuits to said memory modules based upon the sorted power requests.

14. The arbitrator of claim 13 wherein said switching block provides request allocation signals to said sorting block, and wherein said sorting block sorts the power requests based thereon.

15. The arbitrator of claim 14 further comprising a plurality of request decoders connected between the charge pump circuits and said switching block, said request decoders receiving the power requests from said switching block and generating the request allocation signals therefor.

16. The arbitrator of claim 15 further comprising a plurality of driving circuits for the charge pump circuits connected to said request decoders in a multiplexed relationship.

17. The arbitrator of claim 15 wherein said request decoders generate activation signals and stand-by mode signals for respective charge pump circuits.

18. The arbitrator of claim 13 wherein the priority scale is based upon at least one of request states of the power requests, priority information associated with the power requests, and positions of memory modules generating respective power requests.

19. The arbitrator of claim 18 wherein the request states comprise active request states and new request states.

20. A method for distributing supply voltages from a plurality of charge pump circuits to a plurality of memory modules comprising:
    generating power requests for the memory modules;
    sorting the power requests for the charge pump circuits based upon a priority scale; and
    distributing the supply voltages from the charge pump circuits to the memory modules based upon the sorted power requests.

21. The method of claim 20 wherein the priority scale is based upon at least one of request states of the power requests, priority information associated with the power requests, and positions of memory modules generating respective power requests.

22. The method of claim 21 wherein the request states comprise active request states and new request states.

23. A computer-readable medium having computer-executable instructions for performing steps for distributing supply voltages from a plurality of charge pump circuits to a plurality of memory modules, the memory modules generating power requests for supply voltages, the steps comprising:
    sorting the power requests for the charge pump circuits based upon a priority scale; and
    distributing the supply voltages from the charge pump circuits to the memory modules based upon the sorted power requests.

24. The computer-readable medium of claim 23 wherein the priority scale is based upon at least one of request states of the power requests, priority information associated with the power requests, and positions of memory modules generating respective power requests.

25. The computer-readable medium of claim 24 wherein the request states comprise active request states and new request states.

* * * * *